(12) United States Patent
Abraham et al.

(10) Patent No.: US 6,385,082 B1
(45) Date of Patent: May 7, 2002

(54) THERMALLY-ASSISTED MAGNETIC RANDOM ACCESS MEMORY (MRAM)

(75) Inventors: David W. Abraham, Croton-on-Hudson, NY (US); Philip L. Trouilloud, Norwood, NJ (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/708,253

(22) Filed: Nov. 8, 2000

(51) Int. Cl.$^7$ .......................... G11C 11/14; G11C 11/15
(52) U.S. Cl. ...................... 365/171; 365/145; 365/158; 365/173
(58) Field of Search ............................... 365/145, 158, 365/171, 173; 257/295, 427, 421–426

(56) References Cited

U.S. PATENT DOCUMENTS

| 5,640,343 A | | 6/1997 | Gallagher et al. | ........... 365/171 |
|---|---|---|---|---|
| 5,650,958 A | | 7/1997 | Gallagher et al. | ........... 365/173 |
| 5,946,227 A | * | 8/1999 | Naji | ........................... 365/158 |
| 6,114,719 A | * | 9/2000 | Dill et al. | .................... 257/295 |
| 6,163,477 A | * | 12/2000 | Tran | ........................... 365/173 |
| 6,166,948 A | | 12/2000 | Parkin et al. | ............... 365/173 |
| 6,191,972 B1 | * | 2/2001 | Miura et al. | ................. 365/171 |
| 6,272,036 B1 | | 8/2001 | You et al. | ..................... 365/97 |

OTHER PUBLICATIONS

Williams et al.; Scanning Thermal Profiler: App. Phys. Letter 23, pp 1587–1589.

Marvin; Magnetic Recording Handbook, Van Nostrand Reinhold, 1988, pp. 540–580.

R. Merservey and P.M. Tedron, Physics Reports 238, No. 4 (1994) 173–243.

D.J. Monsma and S.S.P. Parkin, Appl. Phys. Lett. 77, 720 (2000).

Application Serial No. 09/708,207 –David W. Abraham, Stuart S. P. Parkin, John C. Slonczewski, Philip L. Trouilloud, Filed on Nov. 8, 2000. *Magnetic Tunnel Junctions Using Ferrimagnetic Materials* (YOR9–1998–0321US1).

\* cited by examiner

*Primary Examiner*—Son Mai
(74) *Attorney, Agent, or Firm*—Marian Underweiser

(57) ABSTRACT

It is important to ensure good selectivity of a single magnetic tunnel junction storage cell within a memory array without affecting nearby storage cells. For this purpose, this memory array of storage cells preferably comprises a) an array of electrically conducting bit lines and electrically conducting word lines which form intersections therebetween, b) a storage cell disposed at each of said intersections, each storage cell comprising at least one reversible magnetic region or layer characterized by a magnetization state which can be reversed by applying thereto a selected external magnetic field, said reversible magnetic layer comprising a material whose magnetization state is more easily reversed upon a change in the temperature thereof, and c) a temperature change generator for changing the temperature of said reversible magnetic layer of only a selected one of said array of storage cells at any moment. To select a cell, it is preferable to select a cell by using a brief pulse of tunnelling current between the intersecting bit and word lines at that cell in order to provide sufficient Joule heating to facilitate a change in the magnetization state of its reversible magnetic layer, which preferably comprises a ferrimagnetic material.

11 Claims, 5 Drawing Sheets

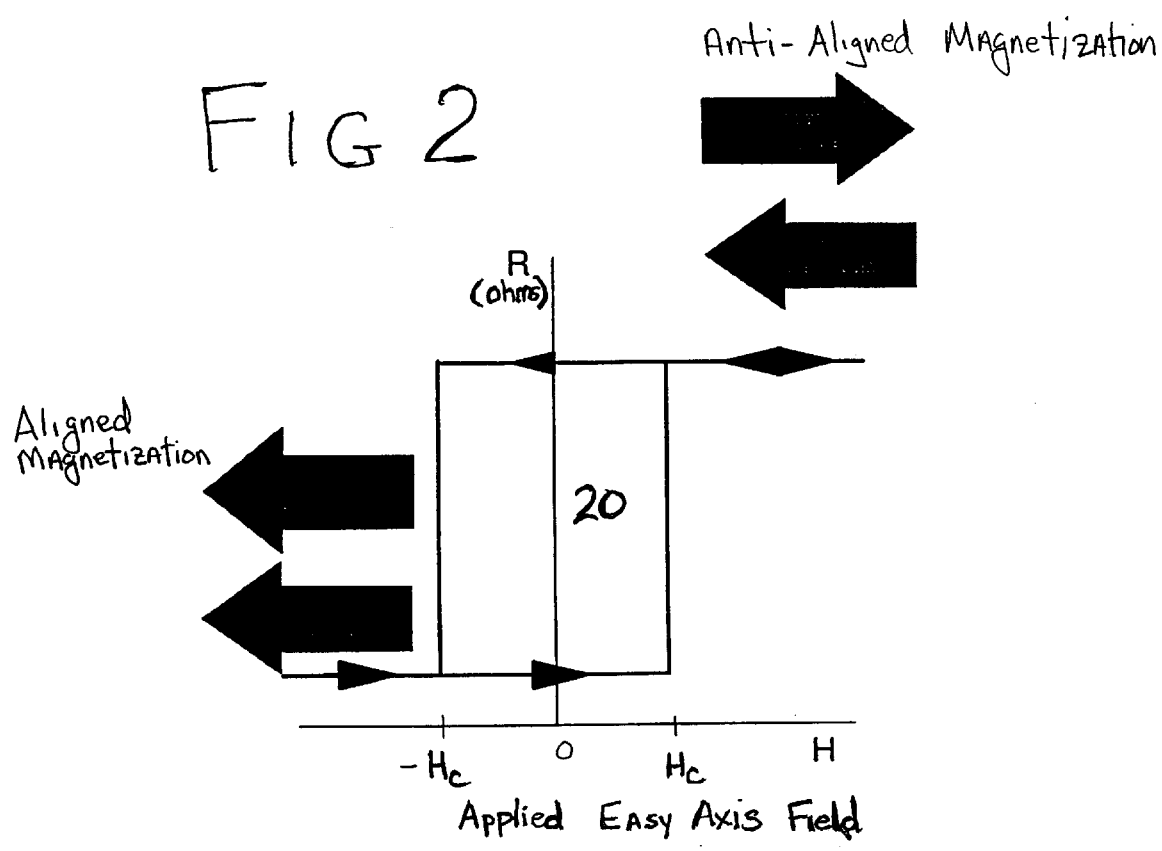

THERMALLY-ASSISTED MAGNETIC RANDOM ACCESS MEMORY (MRAM)

CROSS-REFERENCE TO RELATED APPLICATION

The present application is related to U.S. patent application Ser. No. 09/708,207 filed on Nov. 8, 2000, entitled "Magnetic Tunnel Junctions Using Ferrimagnetic Materials," which is incorporated herein by reference.

STATEMENT OF GOVERNMENT RIGHTS

This invention was made with Government support under grant contract number MDA972-96-C-0030 awarded by the Defense Advanced Research Projects Agency (DARPA) of the United States Department of Defense. The Government has certain rights in this invention.

BACKGROUND OF THE INVENTION

The present invention generally relates to memory arrays of storage cells, and more particularly to a magnetic random access memory (commonly termed "MRAM").

DESCRIPTION OF THE RELATED ART

MRAM technology utilizes storage cells, which may hereinafter sometimes be called MTJ (Magnetic Tunnel Junction) junctions or simply "junctions" which each have at least two magnetic regions or layers with an electrically insulating barrier layer between them. The storage mechanism relies on the relative orientation of the magnetization of the two layers, and on the ability to discern this orientation by electrical means through electrodes attached to these layers. For background, reference made to U.S. Pat. Nos. 5,650,958 and 5,640,343 issued to William Joseph Gallagher et al on Jul. 22, 1997 and Jun. 17, 1997, respectively.

MRAM memory arrays include an array of magnetic memory cells or data storage cells (e.g., cell 50) positioned at the intersections of wordlines 1, 2, 3 and bitlines 4, 5, 6, as shown in FIG. 1.

In a preferred form, each cell includes a magnetically changeable (reversible) or "free" region, and a proximate magnetically reference or "fixed" region, arranged into a magnetic tunnel junction ("MTJ") device (e.g., the term "reference region" is used broadly herein to denote any type of region which, in cooperation with the free or changeable region, results in a detectable state of the device as a whole).

Generally, the principle underlying storage of data in such cells is the ability to change, and even reverse, the relative orientation of the magnetization of the free and reference regions by changing the direction of magnetization along the easy axis ("EA") of the free region, and the ability to thereafter read this relative orientation difference.

More particularly, an MRAM cell is written by reversing the free region magnetization using applied bi-directional electrical and resultant magnetic stimuli via its respective bitline and wordline.

The MRAM cell is later read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states (and therefore the two possible tunneling resistance values) are defined for the cell: aligned (+EA/+EA) and anti-aligned (−EA/+EA).

An ideal hysteresis loop characterizing the tunnel junction resistance with respect to the applied EA field is shown in FIG. 2. The resistance of the tunnel junction can assume one of two distinct values with no applied stimulus in region 20 (e.g., there is a lack of sensitivity of resistance to applied field below the easy axis flipping field strength $\pm H_c$ in region 20).

For example, if the applied easy axis field exceeds $\pm H_c$, then the cell is coerced into its respective high resistance (anti-aligned magnetization of the free region with respect to the reference region) or low resistance (aligned magnetization of the free region with respect to the reference region) state.

Thus, in operation as a memory device, the MRAM device can be read by measuring the tunneling resistance, thereby to infer the magnetization state of the storage layer with respect to the fixed layer.

Thus, FIG. 2 illustrates an ideal hysteresis loop for the MRAM junction of the measured resistance versus applied easy axis filed for an ideal magnetic tunnel junction device. Such a resulting hysteresis loop, shown schematically in FIG. 2, is desirable, since the resistance has one of two distinct possibilities, and there is a lack of sensitivity of measured resistance to applied field below the flipping field strength $H_C$. However, in a practical device, such ideal behavior oftentimes fails to exist, thereby raising many problems.

FIGS. 3(*a*) and 3(*b*) illustrate a geometry typically proposed for addressing the MRAM cell 50. The bias current indicated by the arrow through the cell 50 flows from bit line 5 to word line 2, as shown in FIG. 3(*a*), while the magnetic field-generating current flows in either bit line 5 or word line 2 as indicated by the arrows, but not between the two, as shown in FIG. 3(*b*). Obviously, there may be other considerations, but these are not considered germane to the present invention.

Although the ability to cleanly write the bit (corresponding to the reversal of the free or storage layer in the MRAM geometry discussed above) is important, there is another requirement for the successful operation of the MRAM array.

Specifically, it is necessary to choose, for writing data, only one of the many cells in the array, but without disturbing any of the other cells during this write process.

FIG. 4 illustrates an astroid shape (a so-called "astroid plot" or Stoner-Wolfarth astroid) and selective switching of cells in an array.

The solid line 40 traces the boundaries of stability for a single idealized particle for magnetization pointing either left or right as a function of applied magnetic field. The axes of the plot correspond to the easy and hard axis field (e.g., parallel or perpendicular to the direction preferred by the crystalline anisotropy).

Inside the astroid boundary, there are two stable states, and depending on magnetic history either can be achieved. However, outside the astroid, there is only one state of magnetization which is parallel to the applied magnetic field. Because of the shape of the astroid, the magnetic field may be used to isolate a particular data storage cell for writing.

As shown by the dotted lines forming a box 41 in FIG. 4, easy and hard axis fields (generated by currents through the bit and word lines intersecting at a selected cell) of amplitude $H_W$ force the junction into the right-pointing state. Neighboring junctions (e.g., those either on the same word line or same bit-line) having either insufficient (i.e. Within their asteroid boundaries) easy or hard axis fields are not expected to change state. Thus, as is known, a specific selected device can be written by applying current to both the word and bit lines.

Unfortunately, the above procedure for writing requires very tight manufacturing tolerances.

Specifically, in practice, the solid line 40 of the asteroid expands into a band when considering the range of stability for a population of junctions. If this band becomes too large, then there is no combination of easy and hard axis fields which will definitely (and surely) switch any desired junction, while simultaneously definitely not switching any other junction by mistake. Thus, reliability becomes a problem.

Further, the magnetic field at a junction is due not only to the fields from the bit and word lines, but also to the magnetic state of the junctions around it. This effect, when considered statistically, further reduces the window of operation.

SUMMARY OF THE INVENTION

In view of the foregoing and other problems of the conventional methods and structures, it is an object of the present invention to provide a method of increasing accuracy in the writing process and that reduces the type of errors described above.

Broadly, the present invention therefore provides a memory array of storage cells comprising:

a) an array of electrically conducting bit lines and electrically conducting word lines which form a plurality of intersections therebetween, b) a storage cell (e.g. an MTJ) disposed at each of the aforesaid intersections, the storage cell comprising at least one changeable (preferably reversible) magnetic region characterized by a magnetization state which can be changed (preferably reversed) by applying thereto a selected external magnetic field, the aforesaid changeable (e.g. reversible) magnetic region comprising a material whose magnetization state is more easily changed (e.g. reversed) upon a change in the temperature thereof, and c) a heat generator for heating the aforesaid changeable (e.g. reversible) magnetic region of only a selected one of the aforesaid array of storage cells at any moment.

Preferably, each cell further comprises at least one fixed magnetic region characterized by a magnetization state which cannot be changed or reversed by applying the aforesaid selected external magnetic field to the fixed magnetic region.

According to another preferred embodiment, in addition to the aforesaid changeable magnetic region, each cell further comprises a second "interrogation" magnetic region whose magnetization can be changed (with or without the assistance of thermal changes). During a read operation, the interrogation layer is set in one or more known directions to sense the orientation of the changeable layer.

According to preferred embodiments of the invention, selective heating is applied at the selected storage cell. For this purpose, the aforesaid heat generator comprises a voltage source operable to heat the aforesaid reversible magnetic region (e.g. layer) by passing electric tunnelling current therethrough to cause Joule heating in that selected cell.

Preferably, this tunnelling current is a writing current between a bit line and a word line for writing data into the aforesaid selected storage cell.

Preferably, the aforesaid writing current is passed through the aforesaid reversible magnetic layer for a time period (e.g. as a pulse) which is chosen to be sufficiently short to prevent reversal of the magnetization state of other cells of said memory array by thermal leakage thereto.

According to a preferred embodiment of the invention, the aforesaid reversible magnetic region comprises a ferrimagnetic material, such as $Gd_{23}Fe_{77}$, $Gd_{24}Fe_{76}$, $Tb_{19}Fe_{81}$, $Tb_{21}Fe_{79}$, $Dy_{17}Fe_{83}$, and $Dy_{21}Fe_{79}$. Magnetic alloys of other metals, such as Co with Sm, may also be used.

As will be understood, it may be desirable to maintain the aforesaid reversible magnetic region at the compensation temperature of the the aforesaid ferrimagnetic or other material to maintain stored data in the memory array.

BRIEF DESCRIPTION OF THE DRAWINGS

The foregoing and other objects, aspects and advantages will be better understood from the following detailed description of a preferred embodiment of the invention with reference to the drawings, in which:

FIG. 2 schematically illustrates an ideal hysteresis loop for a reversible magnetic region of a MRAM storage cell;

DETAILED DESCRIPTION OF PREFERRED EMBODIMENTS OF THE INVENTION

Figure 5:
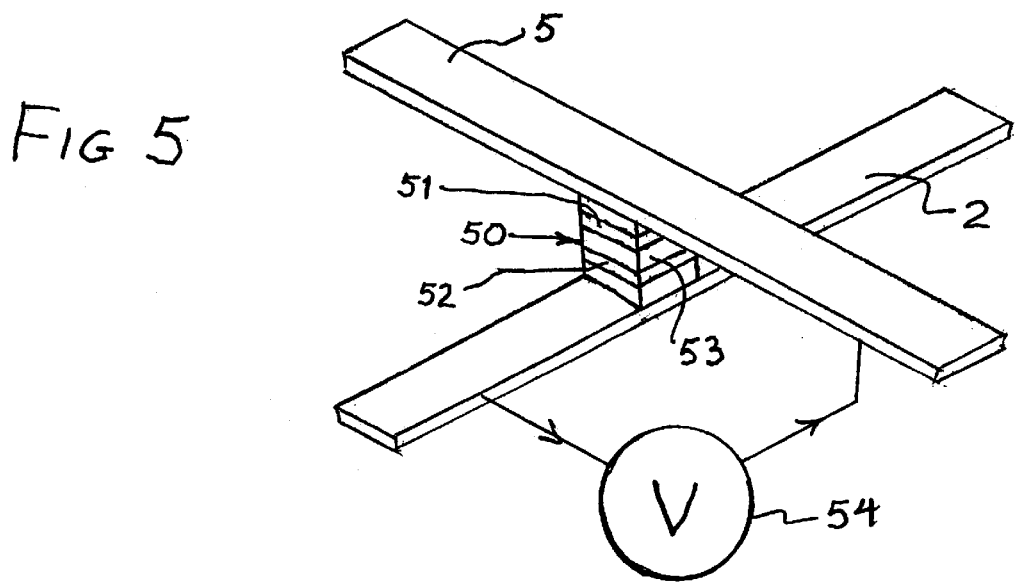
FIG. 5 schematically illustrates a selected storage cell of a memory array in accordance with the first preferred embodiment of the present invention.
Figure 3A:
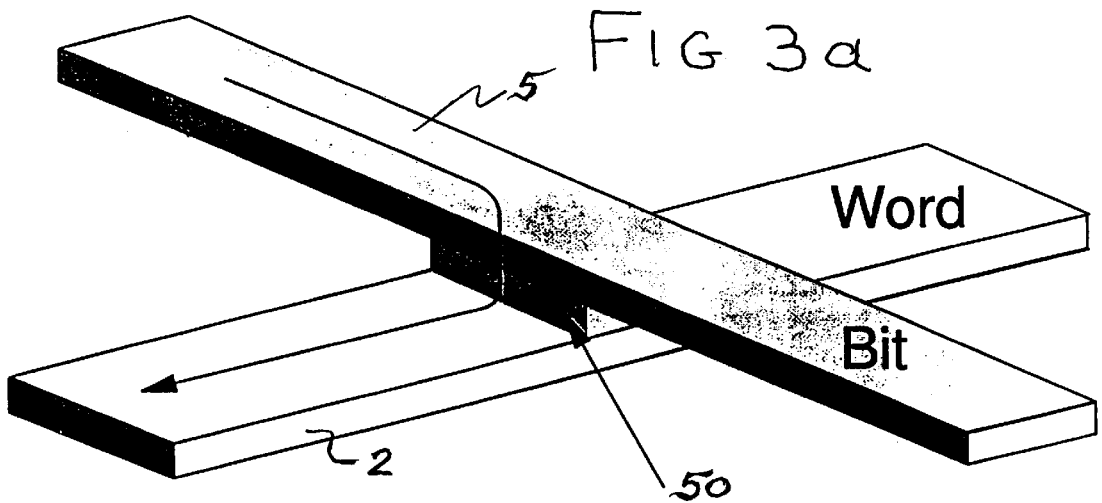
FIGS. 3(a) and 3(b) schematically illustrate a geometry for addressing a MRAM storage cell.
Figure 3B:
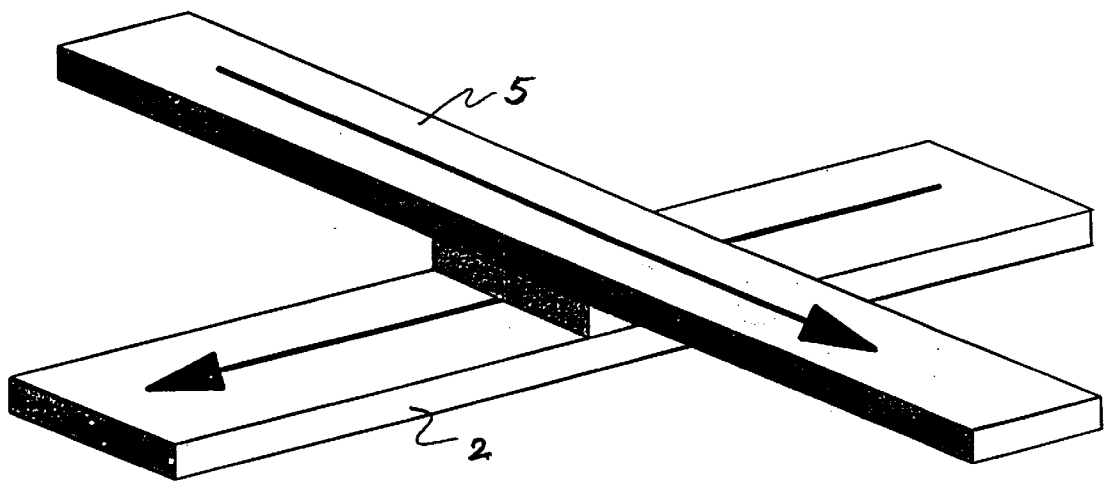
Figure 4:
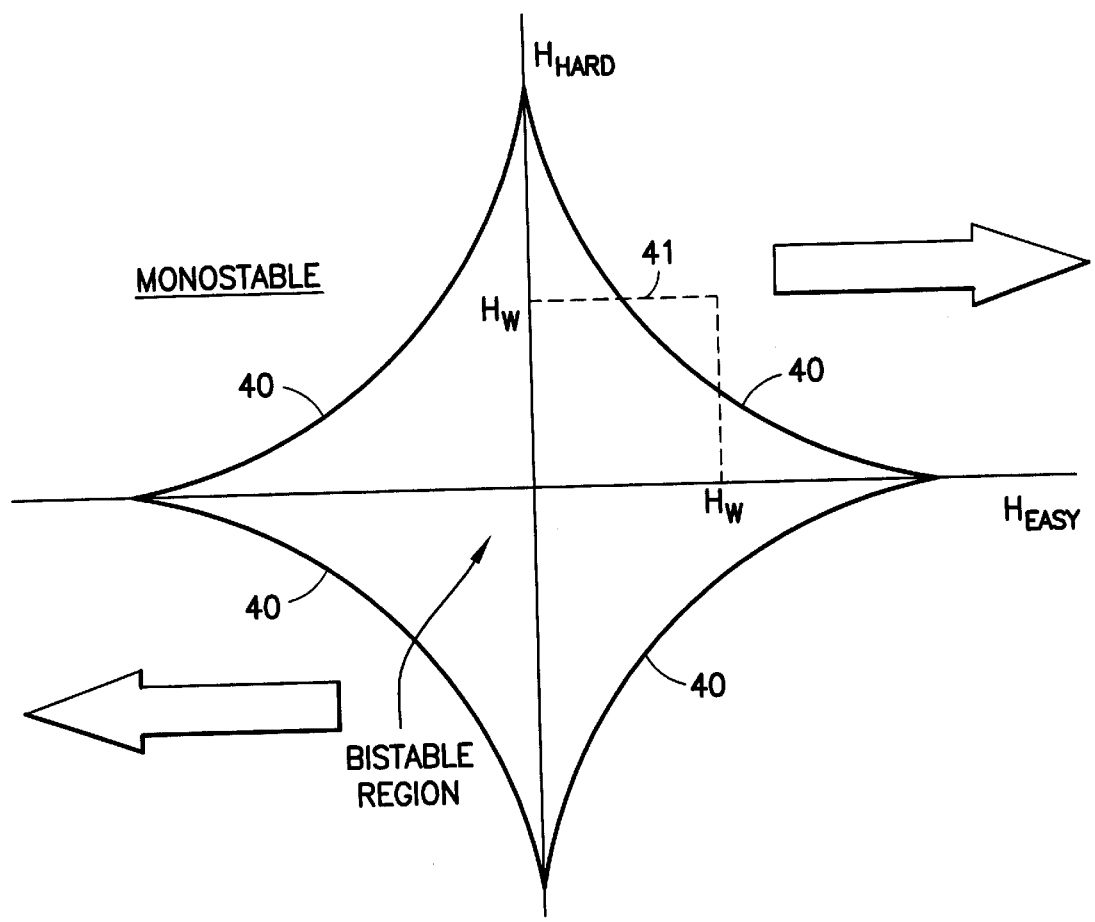
FIG. 4 schematically illustrates an astroid shape for selective switching in the magnetic memory array of FIG. 1.

Referring now to the drawings, and more particularly to FIG. 5, there is shown a first embodiment of the present invention.

Generally, the preferred embodiment of the present invention provides a memory array utilizing a unique and unobvious magnetic tunnel junction (MTJ) storage cell design in which a cell may be selected by heating only the selected cell, thereby reducing cross-talk with adjacent cells, and improving the quality of the switching characteristics.

Figure 1:
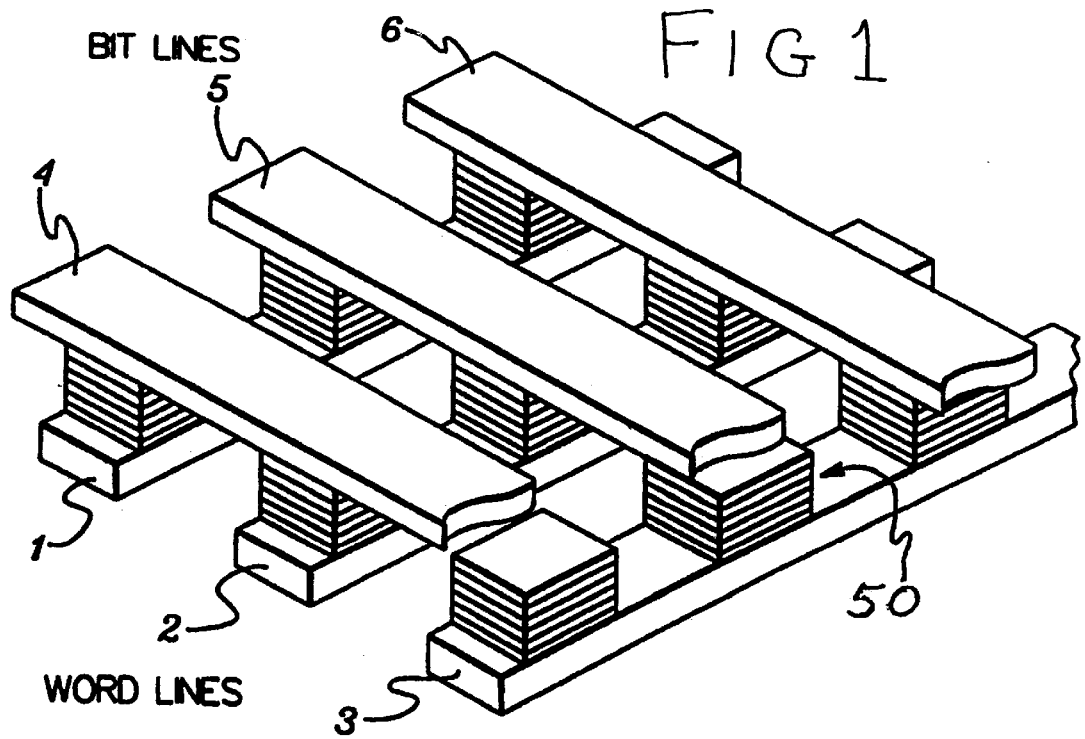
FIG. 1 schematically illustrates a magnetic memory array of MRAM magnetic storage cells for use with the present invention.

With reference to FIG. 1, an exemplary MRAM array includes a set of electrically conductive lines that function as parallel word lines 1, 2, and 3 in a horizontal plane, and a set of electrically conductive lines that function as parallel bit lines 4, 5, and 6 in another horizontal plane. The bit lines are oriented in a different direction (e.g., at right angles to the word lines), so that the two sets of lines intersect when viewed from above.

A memory cell 50, which is shown in greater detail in FIG. 5 below with regard to the present invention, is located at each crossing point of the word lines and bit lines in the intersection region vertically spaced between the lines. Three word lines and three bit lines are illustrated in FIG. 1, but the number of lines would typically be much larger.

As will be understood (e.g. From Gallagher et al U.S. Pat. Nos. 5,650,958 and 5,640,343) while not shown in FIG. 5, the cell 50 of the memory array may be formed on a substrate, such as a silicon substrate on which there would be other circuitry. Also, a layer of insulating material is usually located between the bit lines and word lines at regions of the MRAM memory array other than the intersecting regions.

The memory cell 50 will be described in more detail with reference to FIG. 5. The memory cell 50 is formed on and in contact with a word line 2 and bit line 5.

Storage cell 50 is formed of a number of vertically stacked regions or layers. In particular, cell 50 comprises both a fixed or "pinned" reference layer 52 and a reversible or "free" layer 51 separated by an electrically insulating tunnel barrier layer 53. As will be understood from Gallagher et al, supra, The magnetization of pinned layer 52 is oriented in the plane of the layer but is fixed so that it may not be rotated or reversed in the presence of an applied external magnetic fields generated by write currents through bit line 5 and word line 2. By contrast, the magnetization of free layer 51 can be rotated (or reversed) in the plane of layer 51 relative to the fixed magnetization of layer 52. The amount of tunnelling current that flows perpendicularly through magnetic layers 51, 52 and through the intermediate tunnelling insulating layer 53 (e.g. $Al_2O_3$) depends on the relative magnetization directions of magnetic layers 51 and 52.

As will be understood, the free layer 51 is fabricated to have a preferred axis for the direction of magnetization called the easy axis. There are two possible reversible directions of magnetization of the free layer 51 along this easy axis which define the two states of the memory cell 50.

During memory array operation, when a sufficiently large current is passed through both a word line 2 and a bit line 5 of the MRAM cell 50, the self-field generated by the combined current at the intersection of the word and bit lines will rotate the magnetization of the free layer 51 of the single particular cell 50 located at the intersection of the energized word and bit lines. The current levels are designed so that the combined self-field exceeds the switching field of the free layer 51. This self-field is designed to be much smaller than the field required to rotate the magnetization of the reference layer 52.

The state of the memory cell 50 is determined by measuring the resistance of the memory cell when a sense current, much smaller than the write currents, is passed perpendicularly through it. The self-field of this sense or read current is negligible and does not affect the magnetic state of memory cell 50.

According to the first embodiment of the present invention, a brief pulse of write current is applied by voltage source 54 (which serves as a heat generator in this embodiment) to heat the changeable (reversible) magnetic layer 51 of a selected cell 50. This heating serves to isolate the device to be addressed, reducing cross-talk with neighboring cells and improving the quality of the switching characteristics.

Specifically, the present inventors have found that when the selected cell 50 is heated, the magnetic field required to switch that specific cell is reduced. If the magnetic field bias is applied simultaneously (or at least before the layer 51 recools), only the heated cell will be reversed, provided that the magnetic field strength is both larger than the coercivity of the hot junction and smaller than the coercivity of the cold junction.

As is well known, ferrimagnetic materials include a plurality (e.g., two) of sub-lattices with opposing magnetization. However, contrary to the case of a anti-ferromagnet, because the two sub-lattices in a ferrimagnet are not identical, the physical properties of a ferrimagnet are quite different from those of an anti-ferromagnet. Ferrimagnetism is usually observed in ferrite-rare earh alloys such as those indicated in FIGS. 6(a)–(c).

Figure 6A:
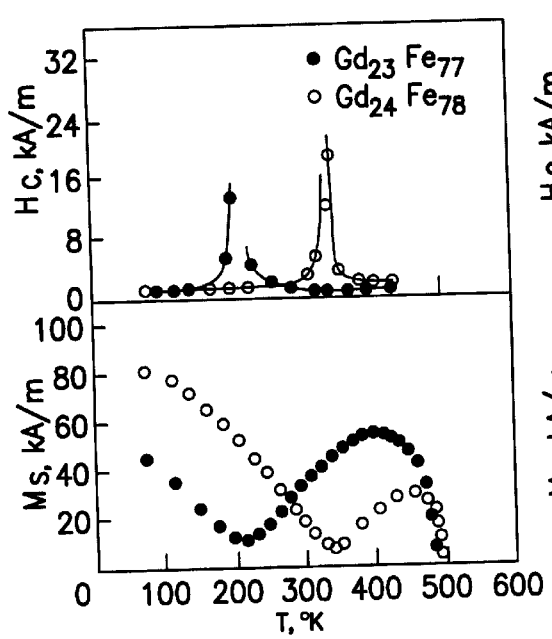
FIGS. 6(a)–6(c) schematically illustrate the temperature dependence of the coercive field of selected ferrimagnetic materials for use in the magnetic tunnel junction according to the present invention.
Figure 6B:
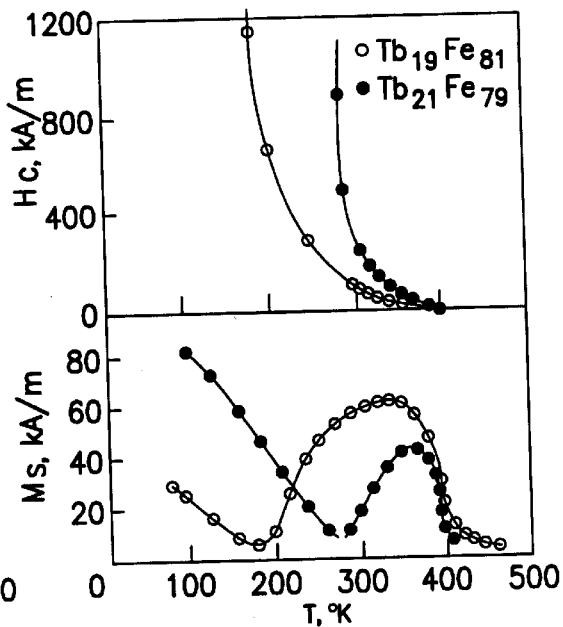
Figure 6C:
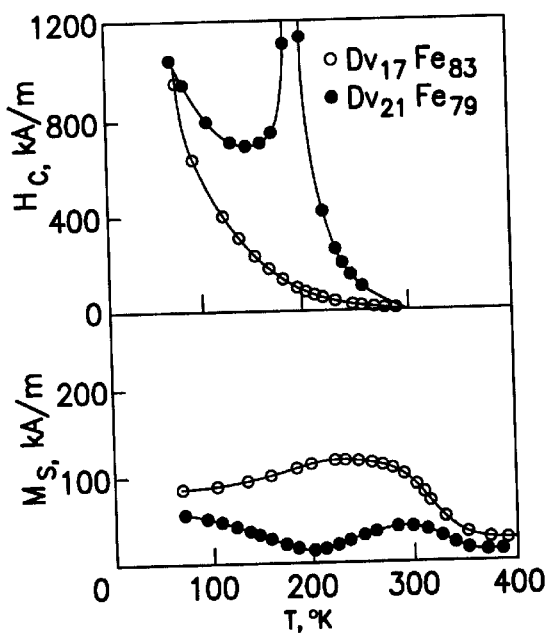

Usually, the moments in the two sub-lattices of ferrimagnetic materials are unequal so that there is a net macroscopic moment. The magnetizations of the sub-lattices have different temperature dependence so that there can be a temperature at which they exactly compensate for one another. At the compensation temperature ($T_{comp}$), the coercivity is very high as there is no net moment to be rotated by an externally applied field. Small changes in temperature close to the compensation point can lead to dramatic changes in coercivity, as shown in FIGS. 6(a)–6(c). Depending on how tightly the operating temperature is controlled, changes of as little as substantially about 5–10° C. can provide a factor of an order of magnitude in the coercive external magnetic field.

As a related issue, temperature control may be provided for the MRAM device to more precisely define the hot and cold coercive fields, using the guidance of graphs such as those shown in FIGS. 6(a)–6(c). With more precise control of the operating temperature, less heating would be required since the chip then could operate closer to the compensation temperature where the rate of change of coercive field with temperature increases.

Estimates of temperature rise depend on the materials used, and the specific geometry of the MRAM cell. However, several simple models provide temperature rises in the range of a few tens of degrees Celsius for micron-sized junctions, resistances of 1 KΩ and a voltage bias of 1 V. The temperature rises further as dimensions are shrunk, so that scalability is feasible.

Of course, as the junction resistance is decreased, then, the temperature increases for a given maximum voltage bias. If the tunnel junction target re sistance is reduced from 1K ohms to 50 ohms, then temperature increases twenty times higher can be expected. These estimates are also based on bulk thermal properties, while it is known that particularly in thin-film media (e.g., see Mee et al., "Magnetic Recording Handbook", McGraw-Hill, 1989, pp. 540–580) that thermal conductivity actually decreases. Hence, the observed temperature rise would be even larger than expected.

The speed of the thermal selection process is also expected to be quite rapid. For example, other experiments on small geometries (e.g., see Williams et al., "Scanning Thermal Profiler", Appl. Phys. Lett. 23, pp. 1587–1589,) have shown thermal time constants in some cases to be shorter than 1 ns. Based on the discussion in Mee et al., mentioned above, the lateral diffusion time constant for heat to propagate in metallic films would be on the order of 1 ns. Hence, the selection process of heating a junction need not be the rate limiting element in an MRAM memory array.

Thus, a robust means is provided for choosing which junction is to be switched, and for minimizing accidentally switching other junctions. Moreover, a potentially large change in coercivity is made possible, and hence a larger margin of error is provided. Additionally, with the thermally-assisted switching, when the cell is not heated, the cold-state coercivity is large and unintentional switching is reduced. Thus, intrinsic cross-talk, as well as external fields, are minimized, and shielding requirements are decreased, to result in a smaller overall structure of MRAM memory arrays.

In summary, a memory cell is provided in which the tunneling current causes a significant and localized temperature rise due to Joule heating. By appropriate choice of materials, the coercivity of a first or a plurality of layers of a magnetic tunnel junction can be made strongly temperature dependent.

Hence, when the cell is written, a large bias current is applied for a brief period of time to cell 50 by voltage source 54, thereby causing a substantial temperature rise. Due to the relatively small size of the junction, the temperature rise will be localized to the specific junction in question. The coercive field is reduced in the heated cell, and therefore a much smaller magnetic field can be applied to reverse the direction of magnetization in the free layer. In contrast, during the read process, a smaller current is typically used, whereby the reading operation leaves the stored 1's an 0's intact As will be understood, such thermally assisted switching ensures that when the cell is not activated (e.g., heated), the cold-state coercivity is large and unintentional switching is minimized.

While the invention has been described in terms of several preferred embodiments, those skilled in the art will recognize that the invention can be practiced with modifications within the spirit and scope of the appended claims.

Having thus described our invention, what we claim as new and desire to secure by Letters Patent is as follows:

1. A memory array of storage cells comprising:
   a) an array of electrically conducting bit lines and electrically conducting word lines which form a plurality of intersections therebetween,
   b) a storage cell disposed at each of said intersections, said storage cell comprising at least one changeable magnetic region characterized by a magnetization state which can be changed by applying thereto a selected external magnetic field, said changeable magnetic region comprising a material whose magnetization state is more easily changed upon a change in the temperature thereof, and
   c) a heat generator for changing the temperature of said changeable magnetic region of only a selected one of said array of storage cells at any moment.

2. A memory array as set forth in claim 1 wherein said storage cell comprises a magnetic tunnel junction and said changeable magnetic region is a reversible magnetic region characterized by a magnetization state which can be reversed by applying thereto a selected external magnetic field, said reversible magnetic region comprising a material whose magnetization state is more easily reversed upon a change in the temperature thereof.

3. A memory array as set forth in claim 2, further comprising at least one fixed magnetic region characterized by a magnetization state which cannot be reversed by applying thereto said selected external magnetic field.

4. A memory array as set forth in claim 2, wherein said heat generator comprises a voltage source operable to heat said reversible magnetic region by passing electric tunnelling current therethrough.

5. A memory array as set forth in claim 4, wherein said tunnelling current is a writing current between a bit line and a word line for writing data into said storage cell.

6. A memory array as set forth in claim 5, wherein said writing current is passed through said reversible magnetic region for a time period which is chosen to be sufficiently short to prevent reversal of the magnetization state of other cells of said memory array by thermal leakage thereto.

7. A memory array as set forth in claim 1, wherein said changeable magnetic region comprises a ferrimagnetic material.

8. A memory array as set forth in claim 7, wherein said ferrimagnetic material is an alloy of Fe and a member selected from the group consisting of Gd, Tb, Dy.

9. A memory array as set forth in claim 7, wherein said ferrimagnetic material is selected from the group consisting of $Gd_{23}Fe_{77}$, $Gd_{24}Fe_{76}$, $Tb_{19}Fe_{81}$, $Tb_{21}Fe_{79}$, $Dy_{17}Fe_{83}$, and $Dy_{21}Fe_{79}$.

10. A memory array as set forth in claim 7, wherein said ferrimagnetic material is an alloy of Co and Sm.

11. A memory array as set forth in claim 7, wherein said changeable magnetic region is maintained at the compensation temperature of said material to maintain stored data in said memory array.

* * * * *